(12) United States Patent
Segawa et al.

(10) Patent No.: US 6,603,172 B1
(45) Date of Patent: Aug. 5, 2003

(54) SEMICONDUCTOR DEVICE AND METHOD OF MANUFACTURING THE SAME

(75) Inventors: Mizuki Segawa, Osaka (JP); Toshiki Yabu, Osaka (JP); Akira Matsuzawa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/536,301

(22) Filed: Mar. 27, 2000

Related U.S. Application Data

(62) Division of application No. 08/874,911, filed on Jun. 16, 1997, now Pat. No. 6,083,785.

(30) Foreign Application Priority Data

Jun. 17, 1996 (JP) .............................................. 8-155316

(51) Int. Cl.[7] .......................... H01L 29/76; H01L 29/94; H01L 31/068; H01L 31/113; H01L 31/119
(52) U.S. Cl. .......................... 257/328; 257/329; 257/379; 257/380; 257/382; 257/384; 257/536
(58) Field of Search ................................ 257/533, 536, 257/537, 538, 328–332, 379–384

(56) References Cited

U.S. PATENT DOCUMENTS

| | | | |
|---|---|---|---|
| 4,367,580 A | 1/1983 | Guterman | |
| 4,609,935 A | * 9/1986 | Kondo | ........................ 357/51 |
| 4,710,791 A | * 12/1987 | Shirato et al. | ............. 357/23.3 |
| 4,866,502 A | * 9/1989 | Tomaszewski et al. | ........ 357/51 |
| 4,949,153 A | 8/1990 | Hirao et al. | |
| 5,027,185 A | * 6/1991 | Liauh | ........................... 357/59 |
| 5,187,122 A | 2/1993 | Bonis | |
| 5,352,923 A | * 10/1994 | Boyd et al. | .................. 257/536 |
| 5,384,274 A | 1/1995 | Kanehachi | |
| 5,391,906 A | 2/1995 | Natsume | |
| 5,414,291 A | 5/1995 | Miwa et al. | |
| 5,457,062 A | 10/1995 | Keller et al. | |
| 5,500,387 A | 3/1996 | Tung et al. | |
| 5,500,560 A | 3/1996 | Kano | |
| 5,597,759 A | 1/1997 | Yoshimori | |
| 5,648,673 A | * 7/1997 | Yasuda | ........................ 257/382 |
| 5,736,421 A | 4/1998 | Shimomura et al. | |
| 5,874,770 A | * 2/1999 | Saia et al. | .................. 257/536 |
| 5,939,753 A | * 8/1999 | Ma et al. | ..................... 257/339 |
| 6,204,105 B1 | * 3/2001 | Jung | ........................... 438/238 |

FOREIGN PATENT DOCUMENTS

| | | |
|---|---|---|
| DE | 0 199 231 | 10/1986 |
| JP | 58089865 | 5/1983 |
| JP | 04051559 | 2/1992 |

OTHER PUBLICATIONS

Patent Abstracts of Japan, vol. 016, No. 271 (E–1218), Jun. 18, 1992 & JP 04 054217 A (Rohm Co., Ltd.) Feb. 28, 1992 (Abstract).

* cited by examiner

*Primary Examiner*—Eddie Lee
*Assistant Examiner*—Jesse A. Fenty
(74) *Attorney, Agent, or Firm*—McDermott, Will & Emery

(57) ABSTRACT

An isolation is formed in a part of a P-well of a semiconductor substrate. A resistor film as a first conductor member is formed on the isolation. An insulating film covering the resistor film except for contact formation regions and an upper electrode film as a second conductor member are formed simultaneously with the formation of a gate electrode and a gate oxide film. Silicide films of a refractory metal are formed on the respective surfaces of the gate electrode, N-type high-concentration diffusion layers, the contact formation regions of the resistor film, and the upper electrode film. By utilizing a salicide process, a resistor and an inductor each occupying a small area can be formed without lowering the resistance of the resistor film. A capacitor, the resistor, and like component are selectively allowed to function.

20 Claims, 11 Drawing Sheets

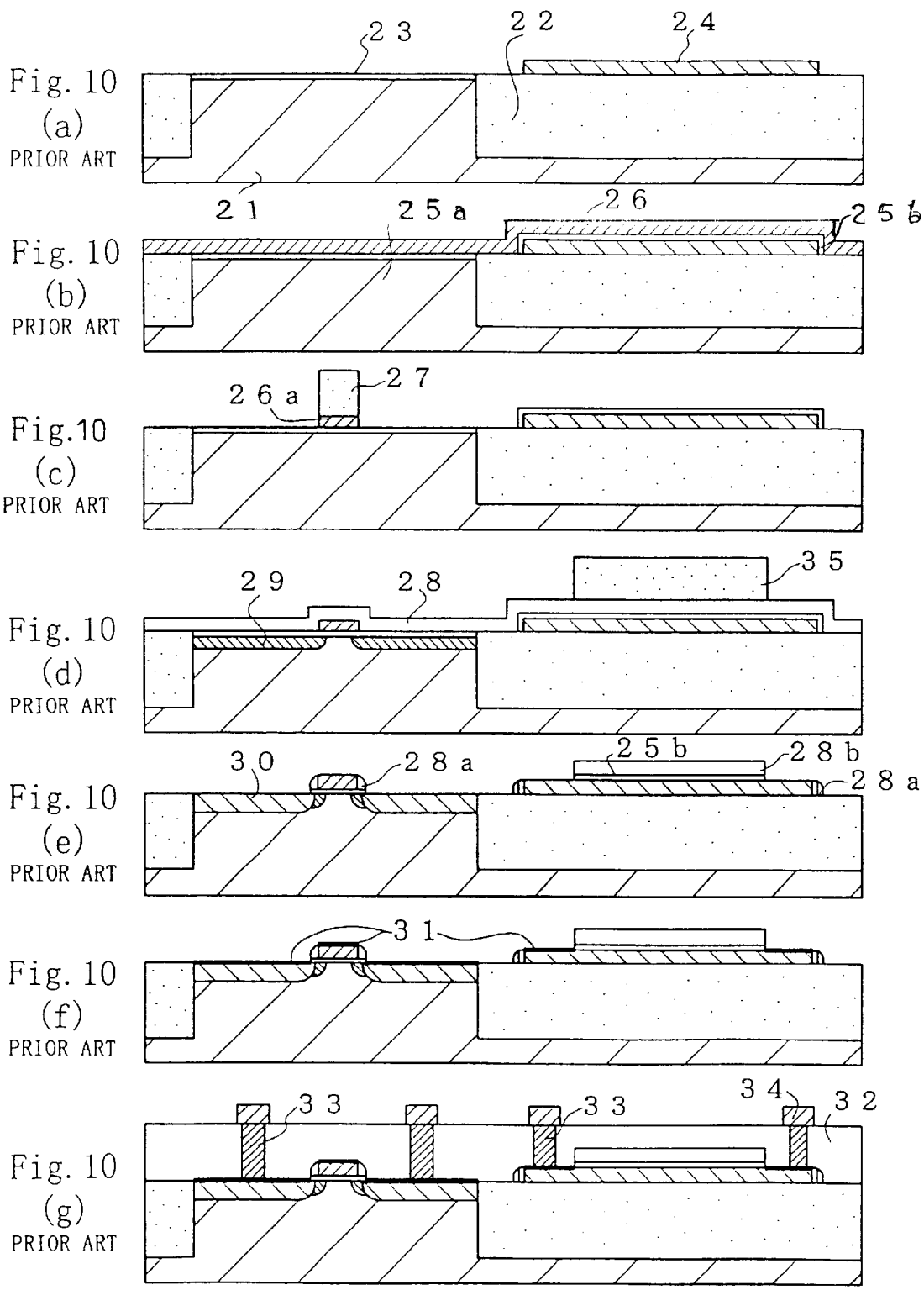
Fig. 10 (a) PRIOR ART
Fig. 10 (b) PRIOR ART
Fig. 10 (c) PRIOR ART
Fig. 10 (d) PRIOR ART
Fig. 10 (e) PRIOR ART
Fig. 10 (f) PRIOR ART
Fig. 10 (g) PRIOR ART

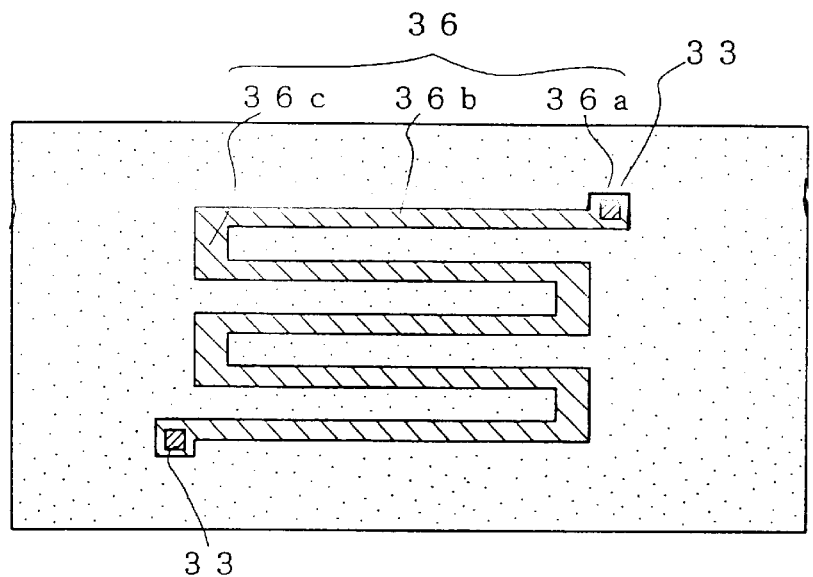
Fig. 11 (a) PRIOR ART
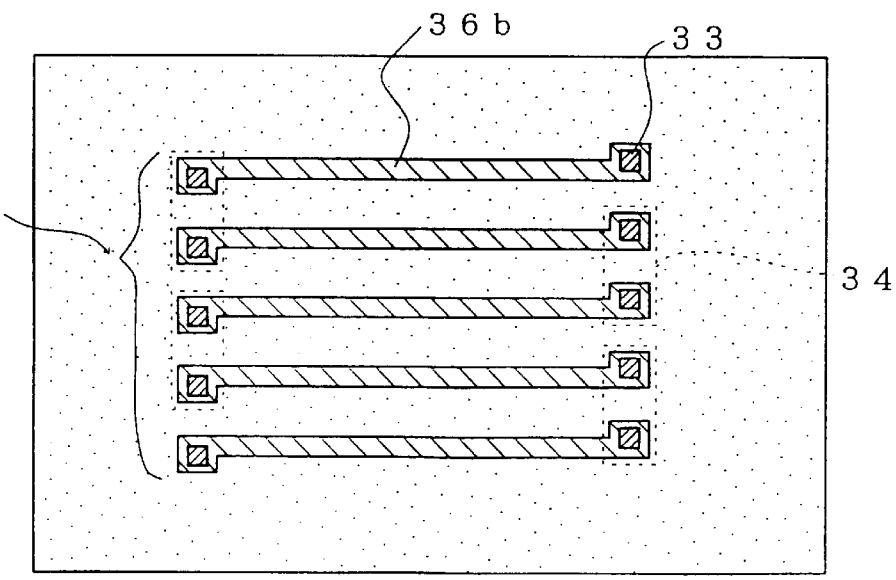
Fig. 11 (b) PRIOR ART

SEMICONDUCTOR DEVICE AND METHOD OF MANUFACTURING THE SAME

This application is a Divisional of application Ser. No. 08/874,911 filed Jun. 16, 1997, U.S. Pat. No. 6,083,785.

BACKGROUND OF THE INVENTION

The present invention relates to a semiconductor device having such elements as a capacitor, a resistor, and a transistor mounted thereon, of which high integration and low cost are required.

A manufacturing process for a conventional semiconductor device having a MOS transistor, a capacitor, and a resistor mounted thereon (combined analog and digital circuit) has been implemented by a normal manufacturing process for the MOS transistor (process for digital devices) combined with an additional manufacturing process for the capacitor and resistor (process for analog devices).

In a MOS transistor formed recently by the normal manufacturing process for digital devices, it has become necessary to reduce the resistance of the gate electrode and source/drain diffusion layers by forming a polycide gate or salicide or selectively growing a metal material, thereby increasing the operating speed of the transistor and reducing the area occupied thereby.

On the other hand, a resistor formed by the process for analog devices should be composed of a high-resistance material to occupy a reduced area as well as have accurately controlled resistance. The resistor is normally formed by using a diffusion layer formed simultaneously with the source/drain regions of the MOS transistor, a polysilicon layer which is to form the gate of the MOS transistor, or either one layer of a two-layer polysilicon electrode forming a capacitor. However, since the demand for a higher-speed, smaller-area MOS transistor has reduced the resistance of the gate electrode and source/drain diffusion layers as described above, the area occupied by the resistor will be increased if the desired resistance is imparted thereto, which leads to the problem that the area occupied by the whole semiconductor device cannot be reduced.

To prevent the problem, there has conventionally been proposed such a method as disclosed in U.S. Pat. No. 4,949,153, wherein an insulating film is formed on a region intended to have relatively high resistance prior to silicidization in a salicide process, which allows a layer with relatively high resistance to be formed simultaneously with the formation of a low-resistance layer. The process of manufacturing an N-channel MOS transistor and a resistor discussed in the foregoing publication will be described with reference to FIGS. 10(a) to 10(g).

First, in the step shown in FIG. 10(a), an isolation 22 is formed by a process of, i.e., trench isolation in a P-well 21 formed in a silicon substrate. Subsequently, a first insulating film 23 composed of a silicon oxide film is formed by, e.g., pyrogenic oxidation, followed by a polysilicon film deposited by, e.g., CVD to serve as a resistor. Thereafter, arsenic ions are implanted in the polysilicon film, which is subjected to a thermal treatment for activation. Thereafter, a desired resist film (not shown) is formed and used as a mask in dry etching for patterning the polysilicon film into a first conductor film 24.

Next, as shown in FIG. 10(b), the first insulating film 23 is removed by wet etching and a gate oxide film 25a is formed. During the formation step, a second insulating film 25b composed of an oxide film is also formed on the top and side surfaces of the first conductor film 24. However, since polysilicon is more likely to be oxidized than single-crystal silicon, the second insulating film 25b is thicker than the gate oxide film 25a. Thereafter, a second conductor film 26 composed of a polysilicon film is deposited by, e.g., CVD to form a gate electrode. After that, arsenic ions are implanted in the second conductor film 26.

Next, as shown in FIG. 10(c), the second conductor film 26 is patterned by dry etching using the desired first resist film 27 as a mask to form a gate electrode 26a.

Next, as shown in FIG. 10(d), impurity ions are implanted in the P-well 21 to form N-type low-concentration diffusion layers 29, which are to serve as N-type LDD (Lightly Doped Drain) layers, followed by a silicon oxide film 28 deposited by, e.g., CVD to serve as a sidewall insulating film. The silicon dioxide film 28 forms sidewalls for the MOS transistor as well as a protective film from silicidization in the subsequent step. At this stage, a second resist film 35 is formed on the silicon oxide film 28 to correspond to the region with high resistance of the first conductor film 24 composing the main portion of a resistor.

Next, as shown in FIG. 10(e), anisotropic etching is performed by using the second resist film 35 as a mask to remove the silicon oxide film 28, which is partially left on the side surfaces of the gate electrode 26a of the MOS transistor and on the side surfaces of the first conductor film 24 that is to serve as the resistor, to form sidewall insulating films 28a. The silicon oxide film 28 is also left on the region previously covered by the resist film 35 as the mask to form an on-resistor insulating film 28b. Impurity ions are further implanted in the P-well 21 to form N-type high-concentration diffusion layers 30, which are to serve as the source/drain regions, and subjected to a thermal treatment for activation.

Next, as shown in FIG. 10(f), a high-melting-point metal such as titanium is deposited and subjected to a rapid-heating thermal treatment so that silicide films 31 composed of a reaction product of silicon and titanium are formed on regions uncovered with the silicon oxide film and composed of silicon, in which the surfaces of the gate electrode 26a, N-type high-concentration layers 30, and first conductor film 24 are exposed. After that, the unreacted portions of the titanium film unformed with the silicide films 31 are removed by wet etching.

Next, as shown in FIG. 10(g), an interlayer insulating film 32, CW contacts 33, metal interconnect layers 34 are formed sequentially on the substrate, resulting in the semiconductor device on which the N-channel MOS transistor having the low-resistance gate, source, and drain and the resistor composed of the high-resistance region are mounted.

Although the foregoing embodiment has used the two-layer polysilicon film consisting of the first and second conductor films 24 and 26, it is also possible to use the second conductor film 26, which is to form the gate of the MOS transistor, to compose the first conductor film 24 that is to serve as the resistor. However, since trends have required higher capacitance from a capacitor used in an analog circuit, it is preferred in the future to use a capacitor having a two-layer conductor film such that an insulating film between the two layers is used as a capacitor (2PS capacitor).

Next, a description will be given to a prior art related to the plan configuration of the resistor.

As shown in FIG. 11(a), the resistor typically has a meander plan configuration composed of a conductor film bent back several times. Specifically, linear portions 36b and fringe portions 36c corresponding to the bent portions alternate between contact formation regions 36a at both ends. However, the presence of the fringe portions 36c, which is varied in configuration, causes variations in resistance and in spreading resistance. As a result, the accuracy of the resistor is lowered even when a specified resistance value is intended for the resistor.

To eliminate the problem, there may be cases where the following method is implemented. As shown in FIG. 11(b), the resistor 36 is composed of the plurality of discrete linear portions 36b parallel with each other. Both ends of the linear portions 36b are formed with the respective CW contacts 33 to be connected to the upper metal interconnect layers 34. Each adjacent two of the linear portions have their ends connected to each other via the two CW contact layers 33 and the metal interconnect layers 34 so as to constitute the whole single resistor. The resistor thus constituted is for preventing variations in resistance, since no bent portion is included therein. However, the foregoing manufacturing method for the conventional resistor and the structure thereof present the following problems.

To form the high-resistance region not to be silicidized in the polysilicon film composing the first conductor film 24, the foregoing manufacturing method shown in FIGS. 10(a) to 10(g) requires an additional lithographic step, which increases the number of manufacturing steps.

In the structure of the resistor shown in FIG. 11(b), the resistance of the CW contacts 33 causes variations in the resistance of the whole structure, resulting in lower accuracy of the resistance. In addition, the area occupied by the whole resistor is increased by regions with margins to be connected to the CW contacts 33, which should be provided on both ends of each of the linear portions 36b.

SUMMARY OF THE INVENTION

A first object of the present invention is to provide a semiconductor device having a transistor and a passive component mounted thereon and a method of manufacturing the same, wherein the mounted passive component exhibits an excellent property without incurring an increase in cost resulting from an increased number of manufacturing steps and an increase in the area occupied thereby.

A second object of the present invention is to provide a semiconductor device having a resistor composed of linear portions and a bent portion mounted thereon, wherein the mounted resistor has accurately controlled resistance with means for eliminating a variation in the resistance of the bent portion.

A first semiconductor device according to the present invention comprises: a first conductor member formed on a part of a semiconductor substrate and having a contact formation region; a second conductor member covering the first conductor member except for the contact formation region; an insulating film interposed between the first and second conductor members; and a low-resistance layer formed in contact with a surface of the contact formation region of the first conductor member and with a surface of the second conductor member, the semiconductor device being capable of selecting at least one of an inductor, a resistor, and a capacitor and allowing the selected one to function by using the first and second conductor members and the insulating film.

The structure enables a reduction in the resistance of the contact formation region of the first conductor member as well as a reduction in the resistance of the second conductor member. When only the first conductor member is allowed to function, an inductor or resistor with desired resistance is obtained. On the other hand, when the first conductor member, the insulating film, and the second conductor member are allowed to function, a capacitor using the first conductor member as the lower electrode, the insulating film as the capacitor insulating film, and the second conductor member as the upper electrode is obtained. Consequently, it becomes possible to selectively mount an inductor, a resistor, and a capacitor on a semiconductor device such that a capacitor is provided at one portion, a resistor or an inductor is provided at another portion, and a resistor or a capacitor is provided at still another portion as desired. Since the capacitor and resistor or the capacitor and inductor are provided overlapped at the same portion when viewed in two dimensions, the area occupied by the components remains small.

The first semiconductor device further comprises a MOS transistor having a gate electrode formed on the semiconductor substrate and source/drain regions formed by introducing an impurity into regions of the semiconductor substrate located on both sides of the gate electrode, wherein another low-resistance layer composed of the same material as the low-resistance layer on the first conductor member is formed in contact with a surface of at least the gate electrode of the gate electrode and source/drain regions.

The structure enables a MOS transistor having a lower-resistance gate electrode or a MOS transistor having a low-resistance gate electrode and low-resistance source/drain regions, a resistor, an inductor, or a capacitor to be mounted on the same substrate, so that the resulting semiconductor device has extremely wide applications.

The first conductor member may be composed of an impurity diffusion layer formed in the semiconductor substrate and the second conductor member may be composed of a polysilicon film.

The structure enables the manufacturing of the semiconductor device by a single-layer polysilicon process, resulting in low manufacturing cost.

The first conductor member may be composed of a first polysilicon film formed on the semiconductor substrate and the second conductor member may be composed of a second polysilicon film formed above the first polysilicon film.

The structure enables the formation of the semiconductor device by a two-layer polysilicon process and provides a capacitor of MIM structure, so that the capacitance property of the resulting capacitor exhibits substantially no dependence on voltage. Moreover, since the resistor is also composed of polysilicon, the resistance of the resistor can be controlled more easily and accurately than in the case where the resistor is composed of the semiconductor substrate.

The low-resistance layer may be composed of a metal silicide film.

The structure enables the formation of a transistor and a passive component each having an excellent resistance property by using a polycide process or salicide process.

The low-resistance layer may also be composed of a low-resistance metal film selectively deposited on the first conductor member and on the second conductor member.

The first semiconductor device further comprises a dummy conductor member arranged in parallel with the first conductor member on the semiconductor substrate and having a contact formation region.

In the structure, the first conductor member and the dummy member form a line-and-space pattern, so that the configuration of the first conductor member is improved in accuracy in a photolithographic step.

The dummy member has a potential which can be fixed to a specified value via the contact formation region.

The structure prevents the voltage of the first conductor member from becoming unstable due to the presence of the dummy member.

A second semiconductor device according to the present invention comprises: a first conductor member formed on a part of a semiconductor substrate and having a contact formation region, the first conductor member having a linear configuration composed of a plurality of linear portions and at least one bent portion connecting the linear portions in a plane parallel with a surface of the semiconductor substrate; an insulating film covering the first conductor member except for the contact formation region and the bent portion; and a low-resistance layer formed in contact with a surface of the contact formation region of the first conductor member and with a surface of the bent portion of the first conductor member.

In the structure, the resistance of the bent portion is extremely lowered in the case where the first conductor member functions as a resistor or an inductor. Accordingly, the resistance of the resistor or inductor is substantially determined by the resistance of the linear portions so that a variation in the resistance of the bent portion exerts a slight influence on the resistance of the whole resistor. Moreover, there is no accuracy degradation resulting from variations in the resistance of a contact member or the like serving as a detour around the low-resistance contact and interconnect layer at the bent portion of the resistor or inductor. What results is a high-accuracy resistor or inductor of extremely simple structure.

The linear portions of the first conductor member may be parallel with each other and the first conductor member may have a meander configuration.

The second semiconductor device further comprises a second conductor member formed to extend over all the linear portions of the first conductor member; and another low-resistance layer formed in contact with a surface of the second conductor member and composed of the same material as the low-resistance layer on the first conductor member such that the semiconductor device is capable of selecting at least one of an inductor, a resistor, and a capacitor and allowing the selected one to function by using the first and second conductor members and the insulating film.

The first conductor member may be configured as a polygonal helix extending outwardly from a center end thereof and terminating at an outer end thereof such that the plurality of linear portions of the first conductor member correspond to individual sides of the polygonal helix and that the bent portion of the first conductor member corresponds to a vertex of the polygonal helix.

The second semiconductor device further comprises: a second conductor member composed of a conductor material and formed into distinct segments each extending over the linear portions parallel with each other and located on the same side relative to the center end of the first conductor member configured as the polygonal helix; and another low-resistance layer formed in contact with a surface of the second conductor member and composed of the same material as the low-resistance layer on the first conductor member such that the semiconductor device is capable of selecting at least one of an inductor, a resistor, and a capacitor and allowing the selected one to function by using the first and second conductor members and the insulating film.

The structure suppresses an increase in the area occupied by the first conductor member which has been sufficiently elongated to achieve high resistance. What results is a structure which allows easy control of resistance and inductance without increasing the area occupied thereby.

The segments of the second conductor member have respective contact regions extending outwardly of the outermost ones of the linear portions of the first conductor member and the second semiconductor device further comprises: a plurality of interconnect layers formed above the first and second conductor members with an interlayer insulating film interposed therebetween; a first connecting member for connecting the individual interconnect layers to the contact formation region of the first conductor member; and a second connecting member for connecting the individual interconnect layers to a plurality of portions of the contact formation region of the second conductor member such that a signal delay circuit is formed between the first and second connecting members.

The structure implements a delay circuit which allows a delay property to be controlled over a wide range while suppressing the attenuation of a signal.

The second semiconductor may further comprise a dummy conductor member arranged in parallel with the outermost ones of the linear portions of the first conductor member on the semiconductor substrate and having a contact formation region and the dummy member preferably has a potential fixed to a specified value via the contact formation region.

A first method of manufacturing a semiconductor device according to the present invention comprises: a first step of forming a first conductor member on a semiconductor substrate having at least a passive component formation region; a second step of forming an insulating film on at least the first conductor member; a third step of depositing a conductor film covering at least the insulating film; a fourth step of patterning the conductor film to form a second conductor member covering the conductor film except for at least a contact formation region thereof; and a fifth step of forming a low-resistance layer on an exposed surface of the first conductor member and on a surface of the second conductor member, wherein the first conductor member, the second conductor member, and the insulating film form at least one of an inductor, a resistor, and a capacitor in the passive component formation region.

The method allows a reduction in the resistance of only the contact formation region without reducing the resistance per unit length of the first conductor member. As a result, a resistor and an inductor having a desired resistance property is formed in a reduced number of steps without increasing the area occupied thereby.

The semiconductor substrate may further be provided with an active component formation region, the second step may include forming the insulating film also on the semiconductor substrate in the active component formation region, the third step may include depositing the conductor film also on the insulating film in the active component formation region, the fourth step may include patterning the conductor film and the insulating film to form a gate insulating film and a gate electrode therefrom in the active component formation region, and the fifth step may include forming the low-resistance layer on a surface of at least the gate electrode in the active component formation region.

The methods provides a manufacturing process combining a digital process with an analog process, which enables the formation of a semiconductor device having an active component and a variety of passive components mounted thereon.

The first method of manufacturing a semiconductor device further comprises a step of forming an isolation on the semiconductor substrate such that the isolation surrounds the active component formation region, wherein the first step may include depositing a first polysilicon film on the isolation and patterning the first polysilicon film to form the first conductor member, the second step may include oxidizing a surface of the semiconductor substrate in the active component formation region and a surface of the first conductor member in the passive component formation region to form the insulating film, and the third step may include forming a second polysilicon film as the conductor film.

The method enables the formation of a high-accuracy capacitor and a resistor or an inductor with resistance that can be controlled over a wide range by a process combined with a two-layer polysilicon process used generally as a digital process for forming a semiconductor device having a MOS transistor mounted thereon.

The first method of manufacturing a semiconductor device further comprises a step of forming an isolation on the semiconductor substrate such that the isolation surrounds the active component formation region and the passive component formation region, wherein the first step may include introducing an impurity into the semiconductor substrate in the passive component formation region to form the first conductor member, the second step may include oxidizing a surface of the semiconductor substrate in the active component formation region and a surface of the first conductor member in the passive component formation region to form the insulating film, and the third step may include forming a polysilicon film as the conductor film.

The method enables the formation of a semiconductor device having a passive component and an active component mounted thereon by a simple process combined with a single-layer polysilicon process used generally as a digital process for forming a semiconductor device having a MOS transistor mounted thereon.

The first step may include forming a dummy member composed of the same material as the first conductor member in parallel with and outside the first conductor member, the second step may include forming the insulating film also on the dummy member, the fourth step may include forming the second conductor member and a capacitor insulating film each covering the dummy member except for a contact formation region thereof, and the fifth step may include forming the low-resistance layer also on an exposed surface of the dummy member.

In accordance with the method, the first conductor member and the dummy member form a line-and-space pattern, so that the configuration of the first conductor member is improved in accuracy in a photographic step. Moreover, since the contact formation region is also provided in the dummy member, the voltage of the dummy member can be fixed by connecting the dummy member to the upper interconnect layer. This prevents variations in the electric properties of the semiconductor device resulting from the presence of the dummy member in the electrically floating state.

A second method of manufacturing a semiconductor device according to the present invention comprises: a first step of forming, on a part of a semiconductor substrate, a first conductor member having a linear configuration composed of a plurality of linear portions parallel with each other in a plane parallel with a surface of the semiconductor substrate and bent portions connecting the individual linear portions; a second step of forming an insulating film covering a surface of at least the first conductor member; a third step of patterning the insulating film to form a capacitor insulating film covering the first conductor member except for a contact formation region and the bent portions thereof; and a fourth step of forming a low-resistance layer on an exposed surface of the first conductor member.

The method enables the formation of the resistor or inductor having low resistance at the bent portion. The resulting resistor or inductor has a stable resistance property with minimum resistance variations resulting from resistance variations at the bent portion.

In the second method of manufacturing a semiconductor device, there can be performed the process for implementing the foregoing second semiconductor device.

BRIEF DESCRIPTION OF THE DRAWINGS

FIGS. 10(a) to 10(g) are cross-sectional views illustrating a process of manufacturing a conventional semiconductor device having a transistor and a resistor mounted thereon; and FIGS. 11(a) and 11(b) are plan views illustrating a process of manufacturing a conventional resistor in a meander configuration.

DETAILED DESCRIPTION OF THE INVENTION

First Embodiment

A description will now be given to a first embodiment of a semiconductor device having an N-channel MOS transistor and a resistor mounted thereon and a method of manufacturing the same. FIGS. 1(a) to 1(g) and FIGS. 2(a) to 2(c) are cross-sectional views and plan views illustrating a process of manufacturing the semiconductor device according to the first embodiment.

Figure 1:
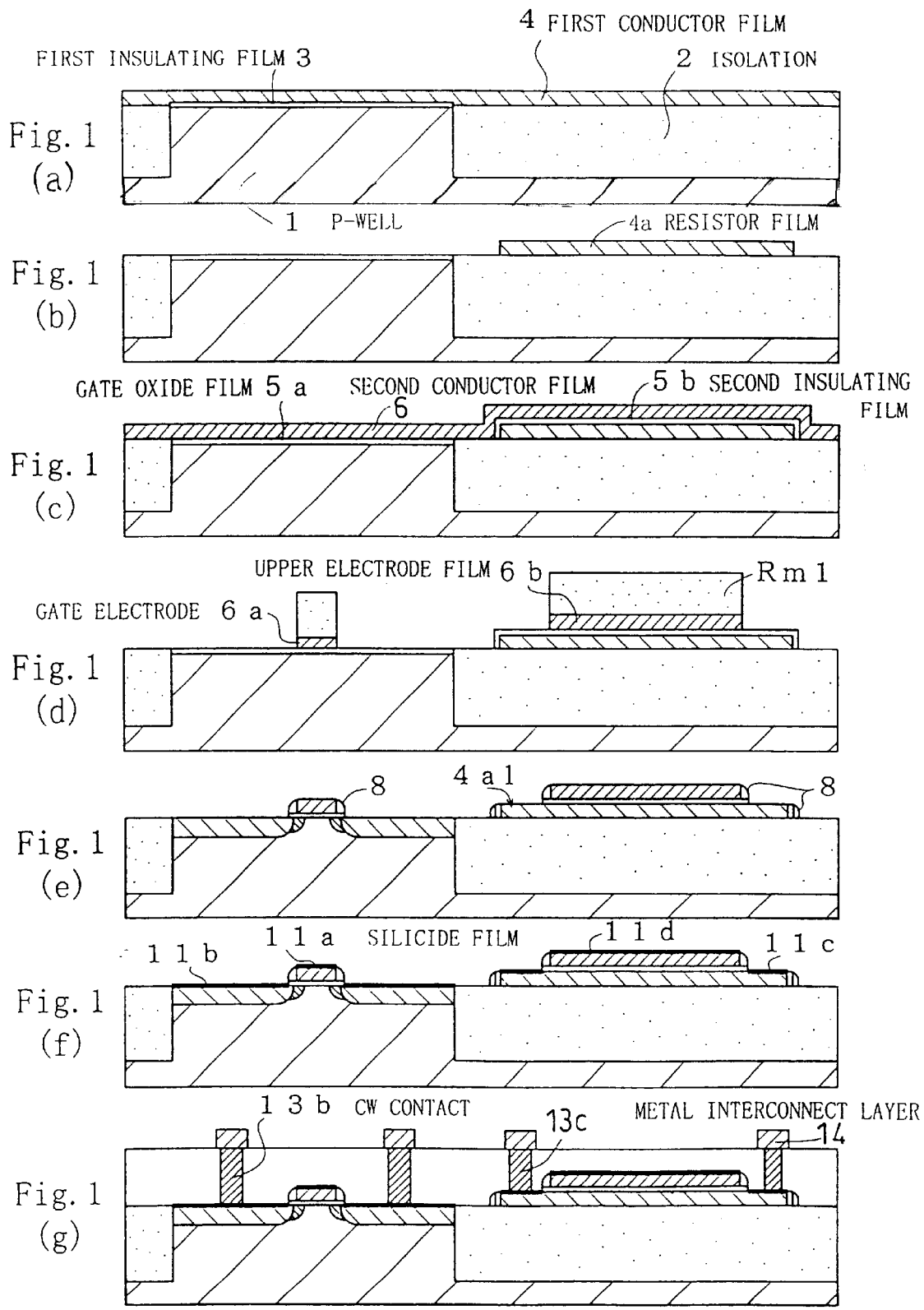
FIGS. 1(a) to 1(g) are cross-sectional views illustrating a process of manufacturing a semiconductor device according to a first embodiment.

First, in the step shown in FIG. 1(a), an isolation 2 is formed by a process of, e.g., trench isolation in a P-well 1 formed in a silicon substrate. Subsequently, a first insulating film 3 composed of a silicon oxide film with a thickness of 20 nm is formed by pyrogenic oxidation, followed by a first conductor film 4 composed of a polysilicon film with a thickness of 200 nm, which is deposited by CVD. Thereafter, arsenic ions are implanted in the first conductor film 4 at 6E15 cm$^{-2}$ with 30 keV, which is subjected to a thermal treatment for activation at 900° C. for 30 minutes.

Next, in the step shown in FIG. 1(b), a resist film (not shown) with openings bored in desired regions is formed on the first conductor film 4 and used as a mask in dry etching for patterning the first conductor film 4 formed on the isolation into a resistor film 4a.

Figure 2:
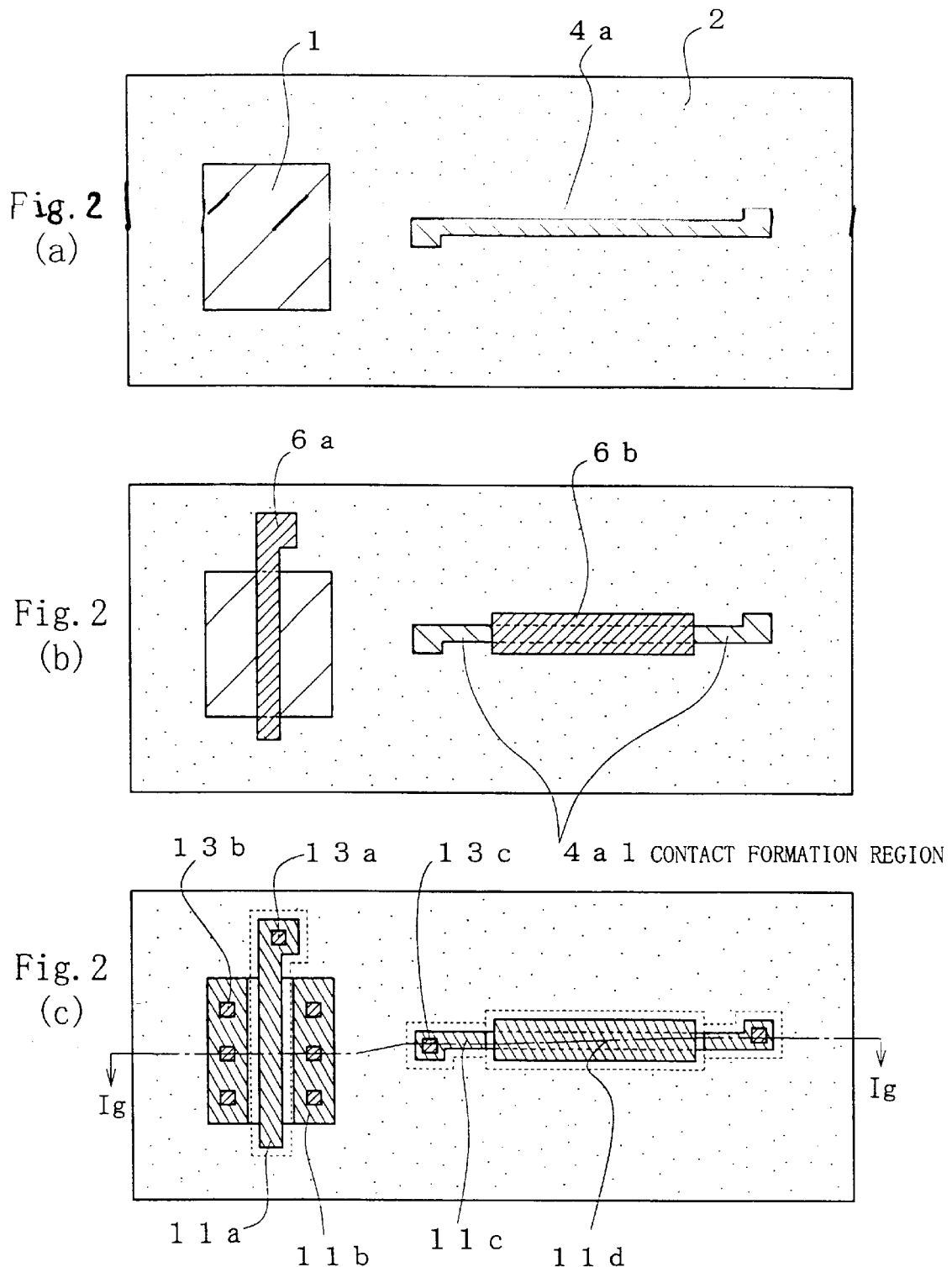
FIGS. 2(a) to 2(c) are plan views illustrating the process of manufacturing the semiconductor device according to the first embodiment.

FIG. 2(a) is a plan view of the resulting structure.

Next, as shown in FIG. 1(c), the first insulating film 3 is removed by wet etching and then a gate oxide film 5a with a thickness of about 10 nm is formed. During the formation step, a second insulating film 5b composed of an oxide film is also formed on the top and side surfaces of the resistor film 4a. However, since polysilicon is more likely to be oxidized than single-crystal silicon, the second insulating film 5b has a thickness of about 20 nm, which is larger than the thickness of the gate oxide film 5a. Furthermore, a second conductor film 6 composed of a polysilicon film is deposited by, e.g., CVD to a thickness of about 300 nm. Thereafter, arsenic ions are implanted in the second conductor film 6 at 6E15 cm$^{-2}$ with 30 keV.

Next, in the step shown in FIG. 1(d), a resist film Rm1 having desired openings is formed on the second conductor film 6 and used as a mask in dry etching for patterning the second conductor film 6 into a gate electrode 6a and the upper electrode film 6b of a capacitor.

FIG. 2(b) is a plan view of the resulting structure, in which the gate electrode 6a obtained by patterning the second conductor film 6 extends across the center of the P-well 1 between the isolation 2 on both sides. The upper electrode film 6b of the capacitor obtained by patterning the second conductor film 6 covers the resistor film 4a except for both end portions thereof. The both end portions of the resistor film 4a are exposed to form contact formation regions 4a1.

Next, in the step shown in FIG. 1(e), impurity ions are implanted in the P-well 21 to form N-type high-concentration diffusion layers 10, which are to serve as N-type LDD (Lightly Doped Drain) layers. After that, a silicon oxide film, which is to serve as a sidewall insulating film, is deposited by, e.g., CVD to a thickness of about 150 nm and subjected to anisotropic dry etching for etching back the silicon oxide film. The portions of the silicon oxide film left on the side surfaces of the gate electrode 6a, resistor film 4, and upper electrode film 6b form sidewalls 8.

Impurity ions at high concentration are further implanted from above to form N-type high-concentration diffusion layers 10, which are to serve as source/drain regions, followed by a thermal treatment for activating the impurity at 850° C. for 100 minutes.

Next, in the step shown in FIG. 1(f), a refractory metal such as titanium is deposited to a thickness of about 50 nm by sputtering and subjected to a rapid-heating thermal treatment at 700° C. for 1 minute. Under the thermal treatment, the near-surface portions of regions uncovered with the silicon oxide film and composed of silicon, i.e., the gate electrode 6a, the N-type high-concentration diffusion layers 10, the contact formation regions 4a1 having exposed surfaces in the resistor film 4a, and the upper electrode film 6b are silicidized to form silicide films 11a to 11d composed of a reaction product of silicon and titanium. After that, the unreacted portions of the titanium film unformed with the silicide films are removed by wet etching.

Next, as shown in FIG. 1(g), an interlayer insulating film 12, metal interconnect layers 14, a CW contact 13a between the gate electrode and the metal interconnect layer, CW contacts 13b between the N-type high-concentration diffusion layers and the metal interconnect layers, and CW contacts 13c between the resistor film and the metal interconnect layers are further formed on the substrate. It is to be noted that FIG. 1(g) is a cross-sectional view taken along the line Ig—Ig shown in FIG. 2(c), which will be described later. The CW contacts 13c are formed on the contact formation regions 4a1 on both ends of the resistor film 4a. In the case of allowing the capacitor to function, however, an additional CW contact is also formed between the upper electrode film and the metal interconnect layer. What results is the semiconductor device on which the N-channel MOS transistor having the low-resistance gate electrode and source/drain regions and the high-capacitance resistor and capacitor are mounted.

FIG. 2(c) shows the plan structure at the stage before the metal interconnect layers 14 are formed.

In the structure of the semiconductor device according to the present embodiment, the resistor film 4a is allowed to function as a resistor by connecting the CW contacts formed on the contact formation regions 4a1 of the resistor film 4a to the metal interconnect layers 14. In this case, the resistor film 4a except for the contact formation regions 4a1 is covered with the upper electrode film 6b during the step of silicidization, so that it is not silicidized. By thus using the salicide process, the resistance of the resistor composed of the resistor film 4a can be maintained high, while the resistance of the gate and source/drain regions is lowered, resulting in a reduced area required by the resistor.

By connecting at least one portion of the resistor film 4a and the upper electrode film 6b to the metal interconnect layer via the CW contact, the capacitor using the resistor film 4a as the lower electrode, the second insulating film 5b as the capacitor insulating film, and the upper electrode film 6b as the lower electrode is allowed to function. The capacitor functioning in this case is of so-called MIM structure, so that the capacitance property thereof exhibits no dependence on voltage and hence excellent electric properties are obtained.

As for the portions not used to form the capacitor, they are properly unconnected to the metal interconnect layers as in the present embodiment.

The number of steps included in the manufacturing process of the present embodiment is the same as the number of steps included in the manufacturing process for the conventional semiconductor device shown in FIGS. 10(a) to 10(g). Briefly, even the capacitor of MIM structure can be formed in the same number of steps. The capacitor and resistor are selectively allowed to function by varying the pattern of the CW contacts and metal interconnect layers. With the layout, there can be obtained the semiconductor device on which the N-channel MOS transistor having the low-resistance gate, source, and drain and the resistor and capacitor composed of the high-resistance regions are mounted by using the two-layer polysilicon process for forming a semiconductor device having a capacitor mounted thereon.

Second Embodiment

Figure 3:
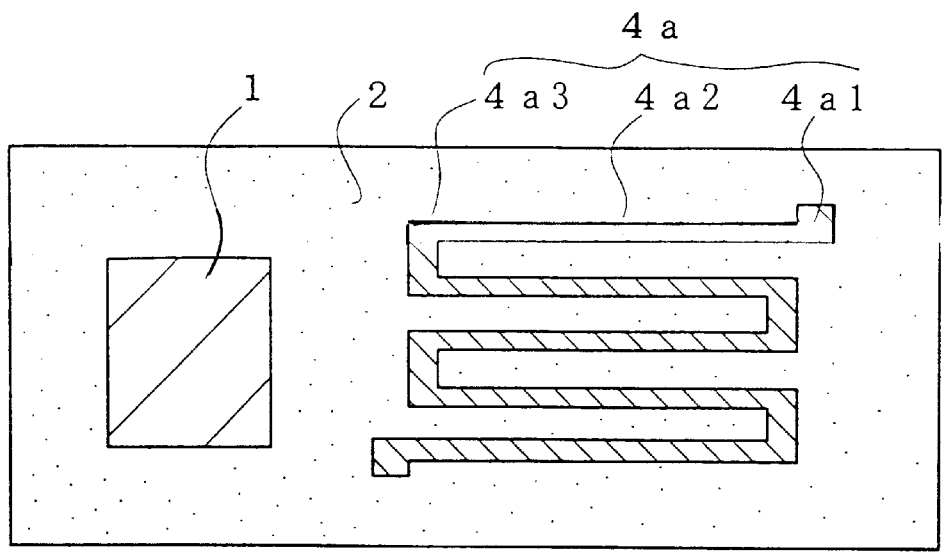
FIGS. 3(a) to 3(c) are plan views illustrating a process of manufacturing a semiconductor device according to a second embodiment.
Figure 3:
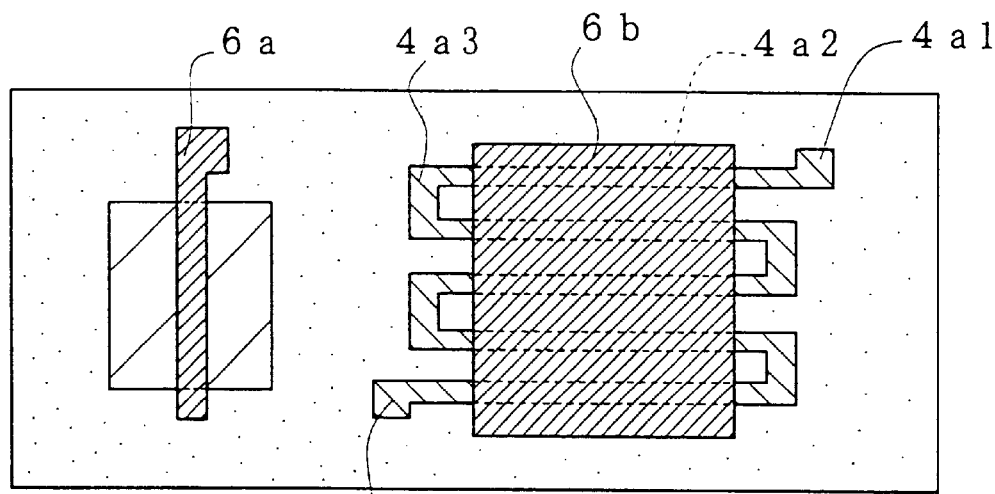
Figure 3:
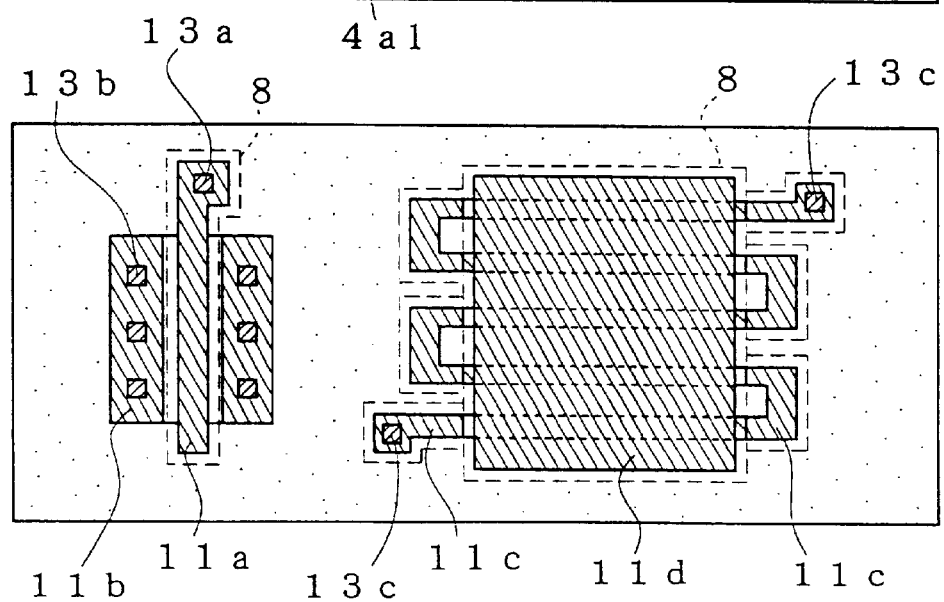

A description will be given next to a second embodiment of a semiconductor device having an N-channel MOS transistor and a resistor with bent portions mounted thereon and a method of manufacturing the same. FIGS. 3(a) to 3(c) are plan views illustrating a manufacturing process for the semiconductor device according to the present embodiment including steps corresponding to the steps shown in FIGS. 2(a) to 2(c) illustrating the first embodiment. The cross-sectional configurations of the semiconductor device in the individual steps are the same as shown in FIGS. 1(a) to 1(g).

As shown in FIG. 3(a), the resistor film 4a formed on the isolation 2 is bent back at several portions to provide high resistance, forming a long meander film consisting of contact formation regions 4a1 at both ends, the total of five linear portions Aa2, and the total of four fringe portions 4a3 as bent portions.

Next, as shown in FIG. 3(b), the insulating film 5 and the second conductor film 6 are formed and patterned into the gate electrode 6a, the gate oxide film 5a, the upper electrode film 6b, and the second insulating film 5b interposed between the upper electrode film 6a and the resistor film 4a. After the formation of the gate electrode 6a and the upper electrode film 6b, the upper electrode film 6b thoroughly covers the linear portions 4a2 of the resistor film 4a and the surface of the substrate exposed between the individual linear portions, while allowing the vicinity of the fringe portions 4a3 of the resistor film 4a and contact formation regions 4a1 at both ends to be exposed. In other words, the second conductor film 6 partially overlies the resistor film 4a.

Next, as shown in FIG. 3(c), at the stage at which silicidization is completed, the near-surface portions of the gate electrode 6a, the N-type high-concentration diffusion layers 10, the fringe portions 4a3 of the resistor film 4a, the contact formation regions 4a1 at both ends of the resistor film 4a, and the upper electrode film 6b are silicidized to form the silicide films 11a to 11d composed of a reaction product of silicon and titanium. On the other hand, the portions of the resistor film 4a covered with the upper electrode film 6b are not silicidized and hence have high resistance. Furthermore, the interlayer insulating film, the metal interconnect layers, the CW contact 13a between the gate electrode and the metal interconnect layer, the CW contacts 13b between the N-type high-concentration diffusion layers and the metal interconnect layers, and the CW contacts 13c between the resistor film and the metal interconnect layers are formed. The CW contacts 13c are formed on both ends of the resistor film 4a with low resistance. In the case where the capacitor is allowed to function, an additional CW contact is also formed between the upper electrode film and the metal interconnect layer. FIG. 3(c) shows the structure before the metal interconnect layers are formed. Although the metal interconnect layers are not shown in the drawing, they are formed in substantially the same manner as illustrated in FIG. 1(g).

With the layout, there can be obtained the semiconductor device on which the N-channel MOS transistor having the low-resistance gate, source, and drain and the resistor and capacitor composed of the high-resistance regions are mounted by using the two-layer polysilicon process for forming a semiconductor device having a capacitor mounted thereon, similarly to the first embodiment.

In the present embodiment, moreover, the linear portions 4a2 of the resistor film 4a are not silicidized to maintain high resistance. On the other hand, the fringe portions 4a3 of the resistor film 4a are silicidized to have low resistance. Consequently, variations in the configurations of the fringe portions 4a3 and the influence of the spreading resistance are minimized so that the resistance property is improved in accuracy by suppressing variations in the resistance of the whole resistor resulting from variations in the resistance of the fringe portions 4a3. Furthermore, the resulting semiconductor device is free from an increase in the area occupied by the resistor and variations in the resistance of the whole resistor resulting from variations in the resistance of the CW contacts, which have been incurred by the prior art structure having the CW contacts as the parts of the resistor as shown in FIG. 11(b).

Although the present embodiment has formed the upper electrode film 6b, only the second insulating film 5b may be used simply as the reaction preventing film during the process of silicidization without forming the upper electrode film 6b. In the structure also, the resistance property of the resistor can be improved in accuracy by suppressing variations in the configurations of the fringe portions and the influence of the spreading resistance, without causing an increase in the area occupied by the resistor.

Third Embodiment

Figure 4:
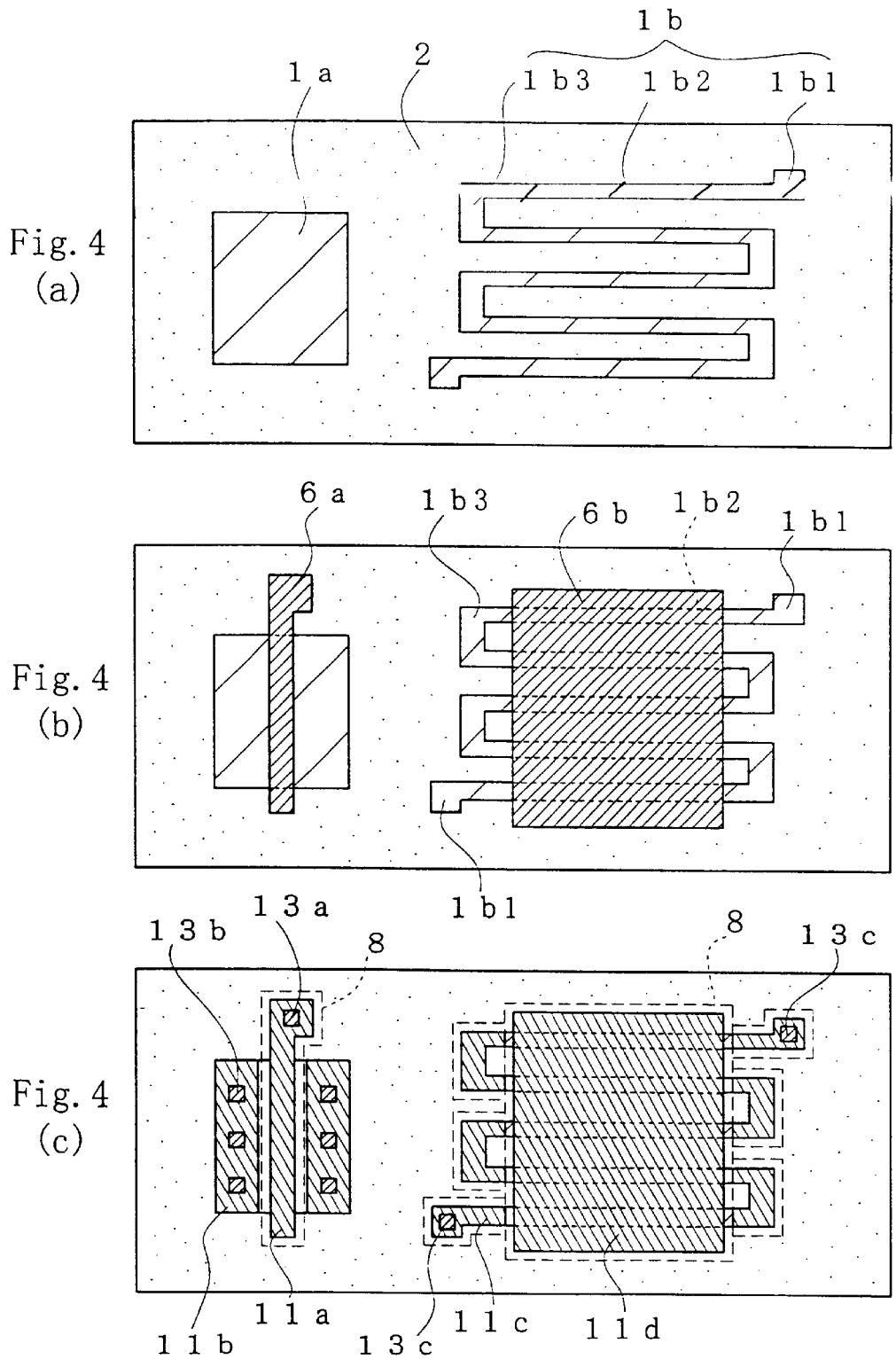
FIGS. 4(a) to 4(c) are plan views illustrating a process of manufacturing a semiconductor device according to a third embodiment.

A description will be given next to a third embodiment of a semiconductor device having an N-channel MOS transistor, a resistor with bent portions, and a capacitor mounted thereon and a method of manufacturing the same. FIGS. 4(a) to 4(c) are plan views illustrating a manufacturing process for the semiconductor device in the present embodiment, which is different from the process of the first embodiment illustrated in FIGS. 1(a) to 1(g) but can easily be analogized to the process illustrated in FIGS. 1(a) to 1(g).

Although the first and second embodiment have composed the resistor of the polysilicon film to form the capacitor of MIM structure, the present embodiment composes the resistor of an impurity diffusion layer within the semiconductor substrate to form a capacitor of MIS structure consisting of the semiconductor substrate, an insulating film, and an overlying conductor.

As shown in FIG. 4(a), in the step of forming the isolation 2 in the P-well 1 within the semiconductor substrate by the process of, e.g., trench isolation, a resistor formation region 1b surrounded by the isolation 2 is also provided in addition to the transistor formation region 1a. The resistor formation region 1b serves as the resistor as well as the lower electrode composing the capacitor. The configuration of the resistor formation region 1b is the same as that of the resistor film 4a in the second embodiment. Hence, the resistor formation region 1b has the contact formation regions 1b1 at both ends, the total of five linear portions 1b2, and the total of four fringe portions 1b3 as the bent portions.

In the step shown in FIG. 4(b), the gate electrode 6a and the upper electrode film 6b are formed. The upper electrode film 6b covers the linear portions 1b2 of the resistor formation region 1b and the substrate surface, while allowing the fringe portions 1b3 and the contact formation regions 1b1 at both ends to be exposed.

Prior to the step shown in FIG. 4(c), the following steps are performed, though the drawing thereof is omitted.

First, N-type low-concentration diffusion layers are formed and a silicon oxide film is deposited thereon. The silicon oxide film is then etched back to form sidewalls on the side surfaces of the gate electrode 6a and the upper electrode film 6b. Subsequently, N-type high-concentration diffusion layers (not shown), which are to serve as the source/drain regions, are formed and subjected to a thermal treatment at, e.g., 850° C. for 100 minutes for activating the impurity. Then, a refractory metal such as titanium is deposited to a thickness of about 50 nm by sputtering and subjected to a rapid-heating thermal treatment at 700° C. for 1 minute. Under the thermal treatment, the near-surface portions of regions uncovered with the silicon oxide film and composed of silicon, i.e., the gate electrode 6a, the N-type high-concentration diffusion layers, and the areas of the resistor formation region 1b having exposed surfaces are silicidized to form the silicide films 11a to 11d. After that, the unreacted portions of the titanium film unformed with the silicide film is removed by wet etching. Furthermore, the interlayer insulating film, the metal interconnect layers, the CW contact 13a between the gate electrode and the metal interconnect layer, the CW contacts 13b between the N-type high-concentration diffusion layers and the metal interconnect layers, and the CW contacts 13c between the resistor film and the metal interconnect layers are formed. The CW contacts 13b are formed on the contact formation regions 1b1 with low resistance on both ends of the resistor. Although FIG. 4(c) shows the structure before the metal interconnect layers are formed, the metal interconnect layers not shown in the drawing are formed in substantially the same manner as illustrated in FIG. 1(g).

In the present embodiment, the resistance of the fringe portions 1b3 of the resistor formation region 1b is lowered, so that basically the same effect as achieved in the second embodiment, i.e., the effect of suppressing resistance variations resulting from the presence of the fringe portions 1b3 and thereby improving the resistance property is achieved. The present embodiment is particularly advantageous in that the two-layer polysilicon film need not be provided and the resistance of the gate, source, and drain as well as the area occupied by the resistor can be reduced, resulting in lower manufacturing cost.

Fourth Embodiment

A description will be given next to a fourth embodiment of a semiconductor device having an N-channel MOS transistor, a resistor with bent portions, and a capacitor mounted thereon and a method of manufacturing the same. FIGS. 5(a) to 5(e) and FIGS. 6(a) to 6(c) are cross-sectional views and plan views illustrating a process of manufacturing the semiconductor device according to the fourth embodiment.

First, in the step shown in 5(a), the isolation 2 is formed by the process of, e.g., trench isolation in the P-well 1 formed in the silicon substrate. Subsequently, the first insulating film 3 composed of a silicon oxide film having a thickness of 20 nm is formed by, e.g., pyrogenic oxidation, followed by the first conductor film 4 composed of a polysilicon film deposited to a thickness of 200 nm by, e.g., CVD. Thereafter, arsenic ions are implanted in the first conductor film 4 at, e.g., 6E15 cm$^{-2}$ with 30 keV, which is subjected to a thermal treatment for activation at, e.g., 900° C. for 30 minutes. Then, a resist film (not shown) with openings bored in desired regions is formed on the first conductor film 4 and used as a mask in dry etching for patterning the first conductor film 4 into the resistor film 4a on the isolation 2.

Figure 6:
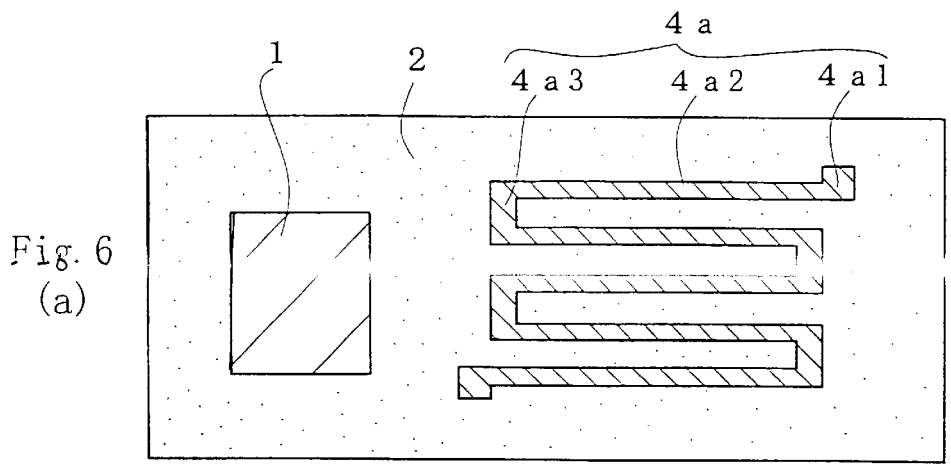
FIGS. 6(a) to 6(c) are plan views illustrating the process of manufacturing the semiconductor device according to the fourth embodiment.
Figure 6:
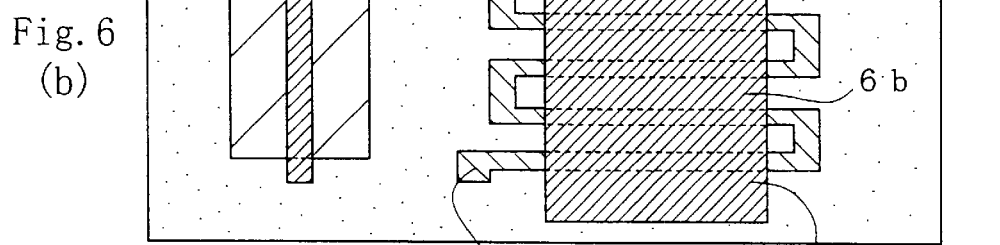
Figure 6:
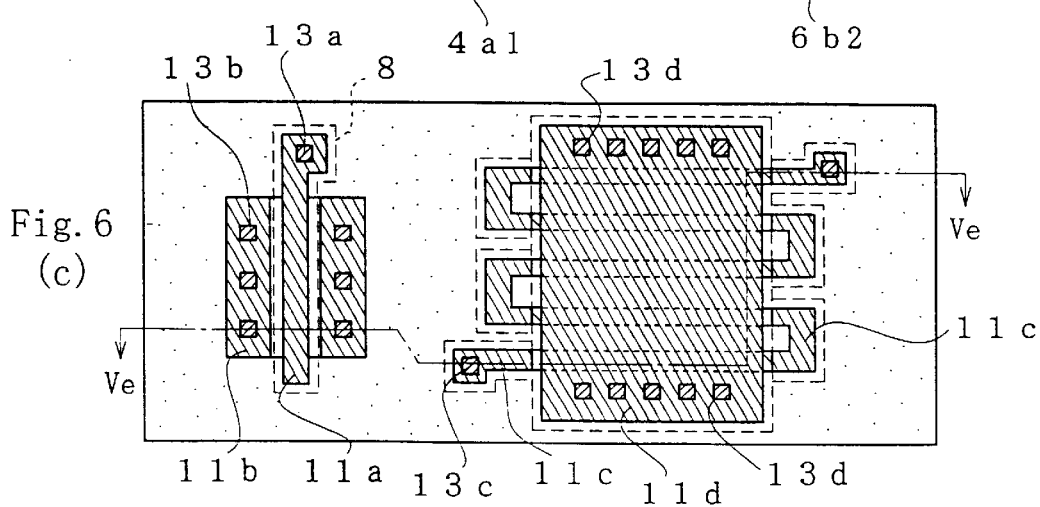

FIG. 6(a) shows the plan structure, which is the same as shown in FIG. 3(a) illustrating the second embodiment. Hence, the resistor 4a has the contact formation regions 4a1 on both ends, the total of five linear portions 4a2, and the total of four fringe portions 4a3.

Figure 5:
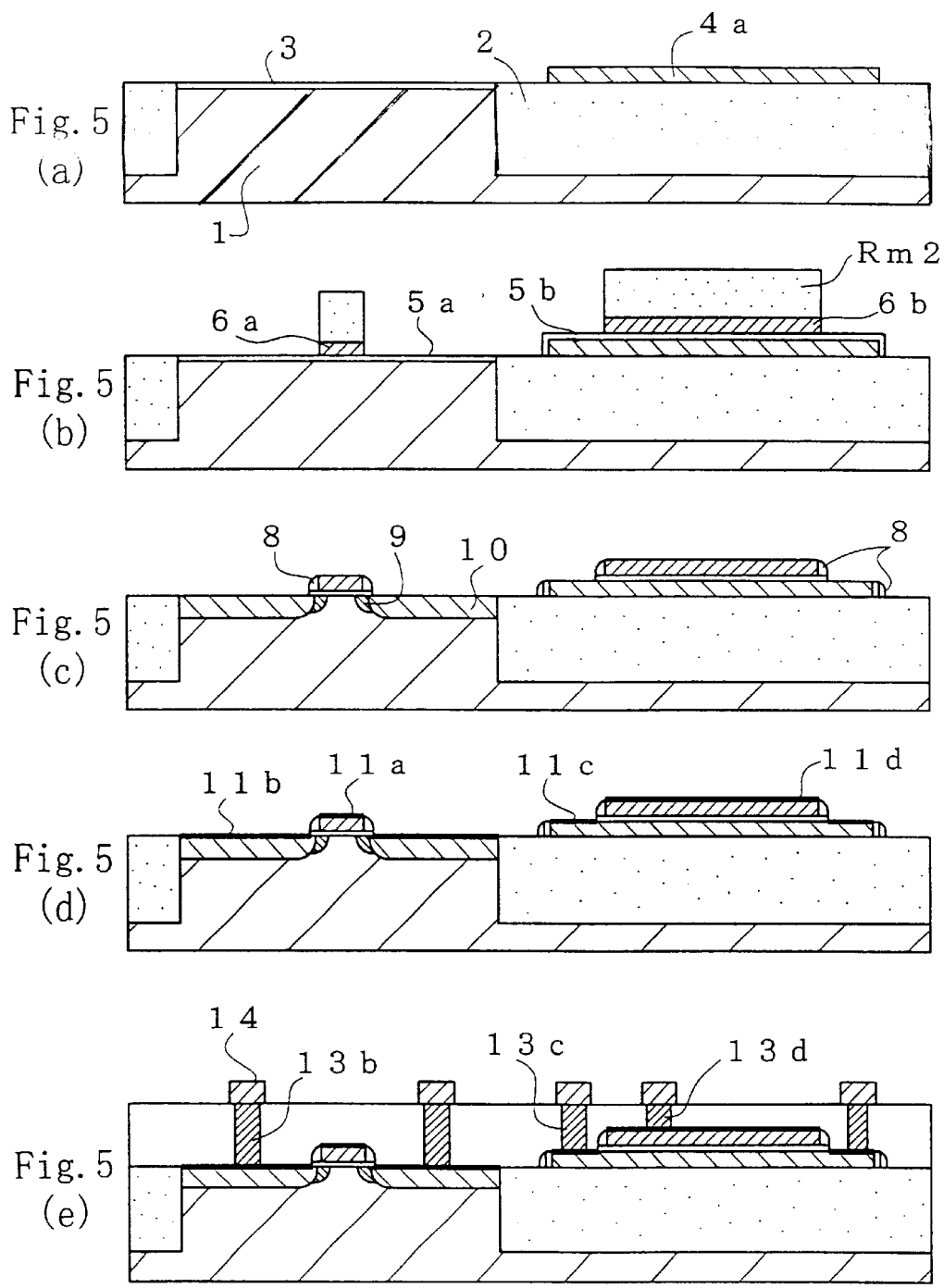
FIGS. 5(a) to 5(e) are plan views illustrating a process of manufacturing a semiconductor device according to a fourth embodiment.

Next, as shown in FIG. 5(b), the first insulating film 3 is removed by wet etching and a gate oxide film 5a having a thickness of about 10 nm is formed. During the formation step, the second insulating film 5b composed of an oxide film is also formed on the top and side surfaces of the resistor film 4a. However, since polysilicon is more likely to be oxidized than single-crystal silicon, the second insulating film 5b has a thickness of about 20 nm, which is larger than the thickness of the gate oxide film 5a. Furthermore, the second conductor film 6 composed of a polysilicon film is deposited by, e.g., CVD to a thickness of 300 nm. Thereafter, arsenic ions are implanted in the second conductor film 6 at, e.g., 6E15 cm$^{-2}$ with 30 keV. Then, a resist film Rm2 having desired openings is formed on the second conductor film 6 and used as a mask in dry etching for patterning the second conductor film 6 into the gate electrode 6a and the upper electrode film 6b of the capacitor.

FIG. 6(b) is a plan view of the resulting structure, in which the gate electrode 6a obtained by patterning the second conductor film 6 extends across the center of the P-well 1 between the isolation 2 on both sides. The upper electrode film 6b of the capacitor obtained by patterning the second conductor film 6 covers only the linear portions 4a2 of the resistor film 4a, while allowing the fringe portions 4a3 and the contact formation regions 4a1 to be exposed. The upper electrode 6b has connecting regions 6b1 and 6b2 extending outwardly of the two outermost ones of the linear portions 4a2 of the resistor film 4a.

Next, in the step shown in FIG. 5(c), impurity ions are implanted in the P-well 21 to form the N-type low-concentration diffusion layers 9, which are to serve as the N-type LDD (Lightly Doped Drain) layers. Thereafter, a silicon oxide film, which is to serve as a sidewall insulating film, is deposited by, e.g., CVD to a thickness of about 150 nm and etched back by anisotropic dry etching so that the portions of the silicon oxide film left on the side surfaces of the gate electrode 6a, resistor film 4, and upper electrode film 6b form the sidewalls 8. Impurity ions at high concentration are further implanted from above to form the N-type high-concentration diffusion layers 10, which are to serve as the source/drain regions, and subjected to a thermal treatment for activating the impurity at, e.g., 850° C. for 100 minutes.

Next, in the step shown in FIG. 5(d), a refractory metal such as titanium is deposited by sputtering to a thickness of about 50 nm and subjected to a rapid-heating thermal treatment at 700° C. for 1 minute. Under the thermal treatment, the near-surface portions of regions uncovered with the silicon oxide film and composed of silicon, i.e., the gate electrode 6a, the N-type high-concentration diffusion layers 10, the areas of the resistor film 4a having exposed surfaces, and the upper electrode film 6b are silicidized to form the silicide films 11a to 11d composed of a reaction product of silicon and titanium. After that, the unreacted portions of the titanium film unformed with the silicide film is removed by wet etching.

As shown in FIG. 5(e), the interlayer insulating film 12, the metal interconnect layers 14, the CW contact 13a between the gate electrode and the metal interconnect layer, the CW contacts 13b between the N-type high-concentration diffusion layers and the metal interconnect layers, the CW contacts 13c between the resistor film and the metal interconnect layers, and CW contacts 13d between the upper electrode film and the metal interconnect layers are further formed on the substrate, resulting in the semiconductor device having the N-channel MOS transistor with the low-resistance gate electrode and source/drain regions and the high-resistance resistor and capacitor mounted thereon. FIG. 6(c) shows the plan structure before the metal interconnect layers 14 are formed.

The present embodiment is characterized in that five CW contacts 13d are formed in each of the end connecting regions 6b1 and 6b2 of the upper electrode film 6b extending outwardly of the resistor film 4a. However, since FIG. 5(e) is a cross-sectional view taken along the line Ve—Ve shown in FIG. 6(c), it shows only one CW contact 13d as a representative.

The structure thus obtained achieves the same effect as achieved in the third embodiment.

In the present embodiment, moreover, the total of ten CW contacts 13d are formed in respective five positions opposed to each other in the end connecting regions 6b1 and 6b2. The adoption of the structure provides a special effect, which will be described below.

Figure 7A:
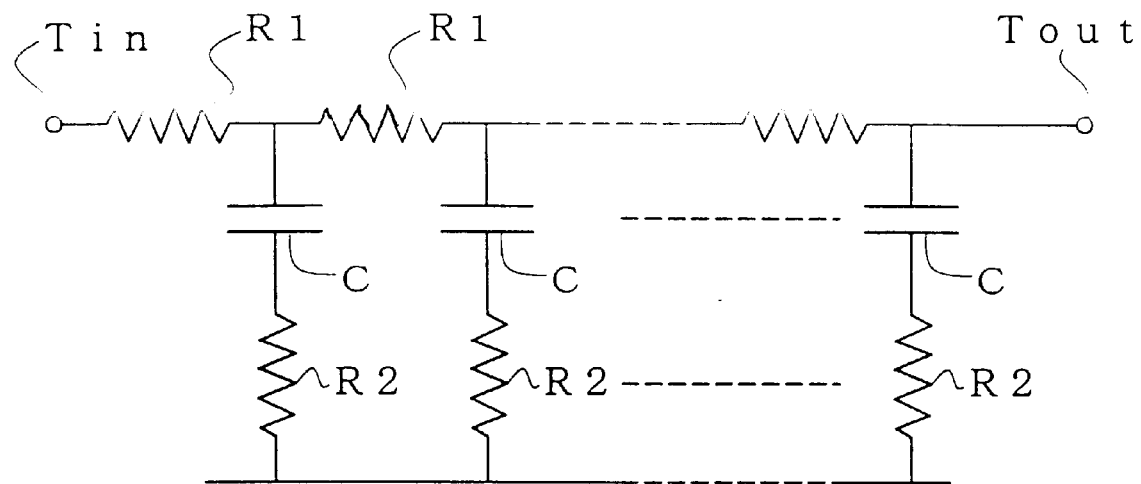
FIG. 7(a) is an equivalent electric circuit diagram of a signal delay circuit composed of a resistor film, a capacitor insulating film, and an upper electrode film in a semiconductor device according to the fourth embodiment
Figure 7B:
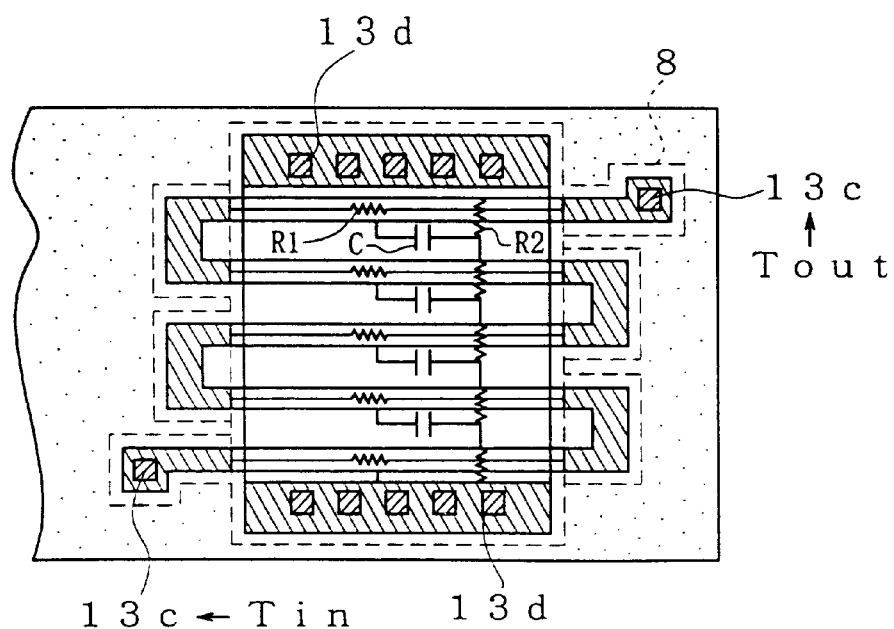
FIG. 7(b) is a view illustrating the signal delay circuit.

FIGS. 7(a) and 7(b) are equivalent circuit diagrams for illustrating the structure of a stepped signal delay circuit composed of the resistor and capacitor formed in accordance with the present embodiment. In the case where the metal interconnect layers 14 connected to the CW contacts 13d are grounded by using the CW contacts 13c on both ends of the resistor as an input terminal Tin and an output terminal Tout, what results is the structure in which the capacitors C and the resistors R2 are connected in parallel between the ground and the respective partial resistors R1 between the end connecting regions 6b1 and 6b2. However, the capacitor C and resistors R1 and R2 of each portion need not be identical. In the structure, the delay property can be adjusted by properly varying the positions of the CW contacts 13d in the connecting regions 6b1 and 6b2 and the number of the CW contacts 13d. Moreover, since the upper electrode of the capacitor has low resistance, the resistance components R2 connected in series to the capacitors C can be reduced, which suppresses the attenuation of a signal in the signal delay circuit.

Fifth Embodiment

Figure 8A:
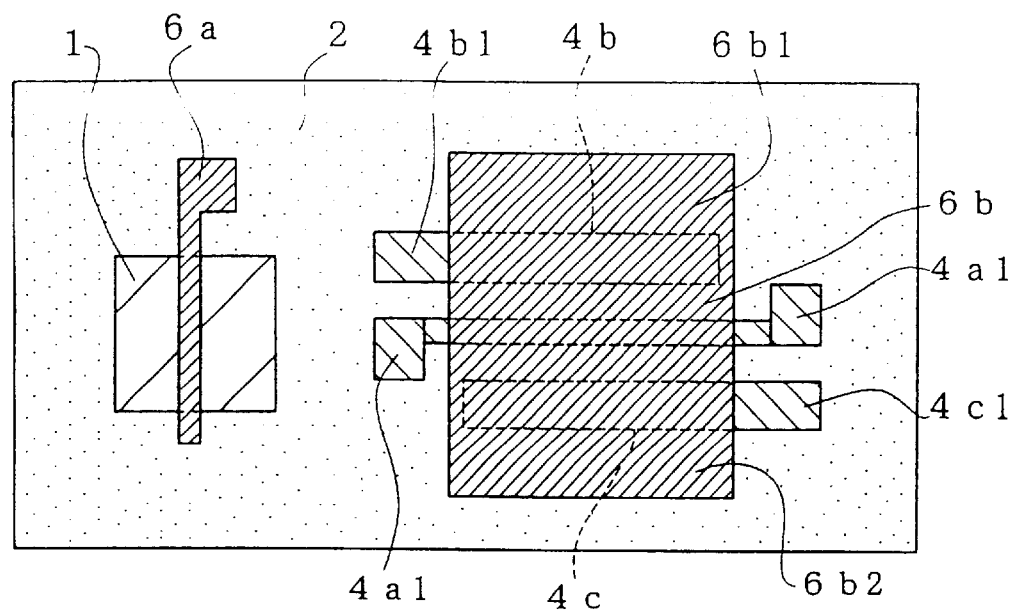
FIGS. 8(a) and 8(b) are plan views illustrating a process of manufacturing a semiconductor device according to a fifth embodiment.
Figure 8B:
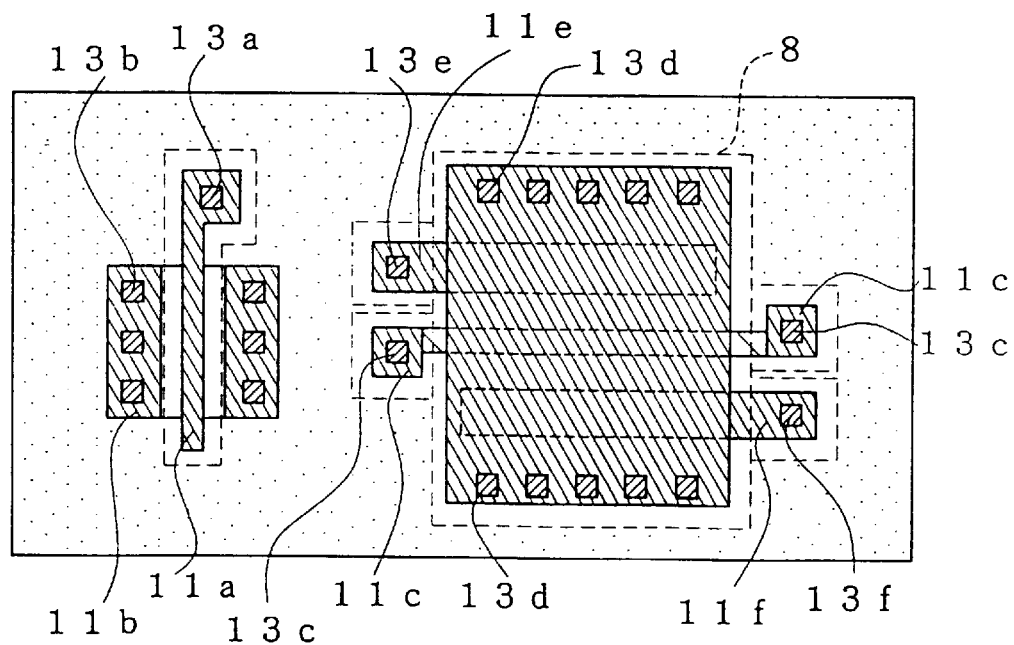

A description will be given next to a fifth embodiment of a semiconductor device having an N-channel MOS transistor, a resistor, a capacitor, and an additional dummy pattern of the resistor and capacitor mounted thereon and a method of manufacturing the same. FIGS. 8(a) and 8(b) are plan views illustrating a manufacturing process for the semiconductor device according to the present embodiment.

In the manufacturing process according to the present embodiment, procedures for forming the cross-sectional structure are substantially the same as those shown in FIGS. 5(a) to 5(e) illustrating the fourth embodiment, so that the drawings and description thereof are omitted here.

In the present embodiment, however, side resistor films 4b and 4c, which are to form a dummy pattern parallel with the resistor film 4a are formed on both sides of the linear resistor film 4a in the step of patterning the first conductor film 4 into the resistor film 4a, as shown in FIG. 8(a). After the second insulating film (not shown) is formed, the second conductor film 6 is patterned into the upper electrode film 6b covering the resistor film 4a except for both end portions thereof and the side resistor films 4b and 4c except for one end portion thereof and having the end connecting regions 6b1 and 6b2 extending outwardly of the side register films 4b and 4c. In the transistor formation region, on the other hand, the gate oxide film and the gate electrode 6a are formed.

Prior to the step shown in FIG. 8(b), the N-type low-concentration diffusion layers, the sidewalls 8, and the N-type high-concentration diffusion layers are formed.

In the step shown in FIG. 8(b), the near-surface portions of the gate electrode 6a, the N-type high-concentration diffusion layers 10, the resistor film 4a, the areas of the side resistor films 4b and 4c having exposed surfaces, and the upper electrode film 6b are silicidized to form the silicide films 11a to 11f composed of a reaction product of silicon and titanium. Furthermore, the interlayer insulating film, the metal interconnect layer, the CW contact 13a between the gate electrode and the metal interconnect layer, the CW contacts 13b between the N-type high-concentration diffusion layers and the metal interconnect layers, the CW contacts 13c between the resistor film and the metal interconnect layers, the CW contacts 13d between the upper electrode film and the metal interconnect layers, and CW contacts 13e and 13f between the respective side resistor films and the metal interconnect layers are formed on the substrate.

In the present embodiment, the resistor film 4a is formed in a line-and-space pattern with the dummy side resistor films 4b and 4c formed on both sides of the resistor film 4a. Since it is well known that patterning accuracy in a photo-lithographic process is particularly high in the central portion of the line-and-space pattern (resistor film 4a), the obtained structure allows high-accuracy control of the resistance of the resistor film 4a.

In the present embodiment, it is also possible to connect one end of each of the side resistor films 4b and 4c to a terminal receiving a specified voltage via the CW contacts 13e and 13f and the metal interconnect layers. For example, one end of each of the side resistor films 4b and 4c can be connected to the ground.

By thus fixing the potentials of the dummy side resistor films 4b and 4c to a specified value via the low-resistance contacts, property variations resulting from the presence of the side resistor films in the electrically floating state can positively be prevented.

It is also possible to allow to function the capacitor using the side resistor films 4b and 4c as the lower electrode, the overlying second insulating film as the capacitor insulating film, and the overlying upper electrode film 6b as the upper electrode.

Sixth Embodiment

Figure 9:
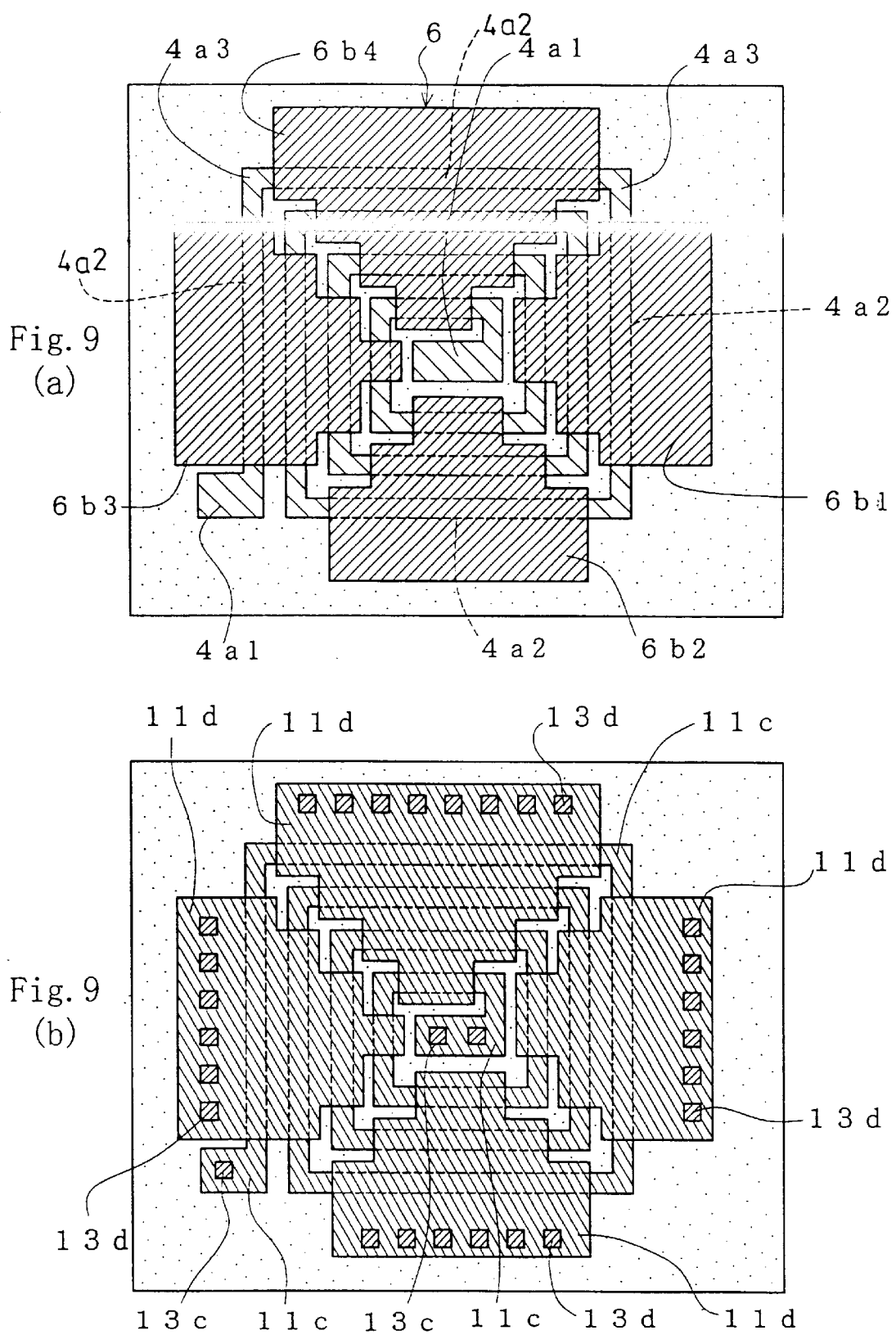
FIGS. 9(a) and 9(b) are plan views illustrating a process of manufacturing a semiconductor device according to a sixth embodiment.

A description will be given next to a sixth embodiment of a semiconductor device having an N-channel MOS transistor, a resistor, an inductor composed of a helical resistor, and a capacitor mounted thereon and a method of manufacturing the same. FIGS. 9(a) and 9(b) are plan views illustrating a manufacturing process for the semiconductor device according to the present embodiment.

In the manufacturing process according to the present embodiment, procedures for forming the cross-sectional structure are substantially the same as those shown in FIGS. 5(a) to 5(e) illustrating the fourth embodiment, so that the drawings and description thereof are omitted here.

In the present embodiment, the transistor, resistor, and capacitor shown in the fourth embodiment are formed, while an inductor having the structure shown in FIGS. 9(a) and 9(b) are formed on another portion of the semiconductor substrate.

As shown in FIG. 9(a), the resistor film 4a configured as a squared helix is formed in the step of patterning the first conductor film 4. Specifically, the resistor film 4a in the form of a squared helix is composed of a linear film starting from a point in the central portion, extending outwardly while defining the squared helix in which the outer sides have the larger lengths, and terminating at a point in the outer portion. What results is the resistor film 4a consisting of the contact formation regions 4a1 on both ends, the linear portions 4a2 corresponding to the individual sides of the squared helix, and bent portions 4a3 corresponding to the individual vertices of the squared helix.

After the second insulating film (not shown) is formed, the second conductor film 6 is patterned into the upper electrode film 6b consisting of four distinct segments each covering the linear portions 4a2 parallel with each other and located on the same side relative to the contact formation region 4a1 at the center end of the resistor film 4a, while allowing the contact formation regions 4a1 at the center and outer ends of the resistor film 4a and the bent portions 4a3 to be exposed. The four segments are provided with respective connecting regions 6b1 to 6b4 extending outwardly of the outermost linear portions 4a2.

As shown in FIG. 9(b), in the silicidization process, the near-surface portions of the areas of the resistor film 4a having exposed surfaces and of the upper electrode film 6b are silicidized to form the silicide films 11c and 11d composed of a reaction product of silicon and titanium. In the step of forming the interlayer insulating film and the metal interconnect layers, the CW contacts 13c between the resistor film and the metal interconnect layers of the inductor and the CW contacts 13d between the upper electrode film and the metal interconnect layers in the inductor region are further formed.

The present embodiment has the advantage of being capable of forming an LCR circuit in addition to the same effects achieved in the fourth embodiment.

It is also possible to use the inductor according to the present embodiment as the resistor. In that case also, the same effect as achieved in the fourth embodiment can be achieved. The present embodiment is particularly advantageous in that the area occupied by the resistor can be reduced by forming the resistor in the helical configuration, not in the meander configuration adopted in the fourth embodiment.

Other Embodiments

Although the foregoing embodiments have described the case where the salicide process is used as means for lowering the resistances of the gate electrode, source/drain regions, and the like, the present invention is not limited to the embodiments. It will be appreciated that similar effects can be achieved even when another resistance lowering technique such as a tungsten affixing technique involving the deposition of a tungsten film by selective CVD is used instead.

For the part of the MOS transistor, it is also possible to use a so-called polycide process wherein only the resistance of the gate electrode is lowered with a silicide or the like.

Although the resistor film 4a has been composed of the silicon substrate or the polysilicon film in the foregoing embodiments, it may also be composed of an amorphous silicon film. It is not necessarily required to compose the resistor film of a semiconductor film. The resistor film may also be composed of a metal film with relatively high resistance with a tungsten affixed layer formed only on the surfaces of the contact formation regions and of the bent portions.

The portions of the resistor film 4a which are to form the contact formation regions are not limited to both ends thereof as in the foregoing embodiments. In the case where only the capacitor is allowed to function, in particular, the contact formation region may be provided in the vicinity of the center of the resistor film 4a.

In the second, fourth, and sixth embodiments also, the configuration of the outermost linear portions can be increased in accuracy by forming the dummy pattern of the resistor film outside the outermost linear portions as in the fifth embodiment, which improves the resistance of the resistor.

We claim:

1. A semiconductor device comprising:
    a first conductor member formed on a part of a semiconductor substrate and having a contact formation region;
    a second conductor member covering said first conductor member except for said contact formation region;
    an insulating film interposed between said first and second conductor members; and
    a low-resistance layer formed in contact with a surface of said contact formation region of said first conductor member and with a surface of said second conductor member, wherein
    said first conductor member is composed of a first polysilicon film formed on said semiconductor substrate; and
    said second conductor member is composed of a second polysilicon film formed above said first polysilicon film,
    said semiconductor device being capable of selecting at least one of an inductor, a resistor, and a capacitor and allowing the selected one to function by using said first and second conductor members and said insulating film.

2. A semiconductor device according to claim 1, further comprising
    a MOS transistor having a gate electrode formed on said semiconductor substrate and source/drain regions formed by introducing an impurity into regions of said semiconductor substrate located on both sides of said gate electrode, wherein
    another low-resistance layer composed of the same material as the low-resistance layer on said first conductor member is formed in contact with a surface of at least said gate electrode of said gate electrode and source/drain regions.

3. A semiconductor device according to claim 1, wherein said low-resistance layer is a metal silicide film.

4. A semiconductor device according to claim 1, wherein said low-resistance layer is a low-resistance metal film selectively deposited on said first conductor member and on said second conductor member.

5. A semiconductor device comprising:
    a first conductor member formed on a part of a semiconductor substrate and having a contact formation region;
    a second conductor member covering said first conductor member except for said contact formation region;
    an insulating film interposed between said first and second conductor members; and
    a low-resistance layer formed in contact with a surface of said contact formation region of said first conductor member and with a surface of said second conductor member, and
    a dummy conductor member arranged in parallel with said first conductor member on said semiconductor substrate and having a contact formation region,
    said semiconductor device being capable of selecting at least one of an inductor, a resistor, and a capacitor and allowing the selected one to function by using said first and second conductor members and said insulating film.

6. A semiconductor device according to claim 5, wherein said dummy member has a potential fixed to a specified value via said contact formation region.

7. A semiconductor device according to claim 5, further comprising:
a MOS transistor having a gate electrode formed on said semiconductor substrate and source/drain regions formed by introducing an impurity into regions of said semiconductor substrate located on both sides of said gate electrode, wherein
another low-resistance layer composed of the same material as the low-resistance layer on said first conductor member is formed in contact with a surface of at least said gate electrode of said gate electrode and source/drain regions.

8. A semiconductor device according to claim 5, wherein
said first conductor member and said dummy conductor member are composed of a first polysilicon film formed on said semiconductor substrate; and
said second conductor member is composed of a second polysilicon film formed above said first polysilicon film.

9. A semiconductor device according to claim 5, wherein said low-resistance layer is a metal silicide film.

10. A semiconductor device according to claim 5, wherein said low-resistance layer is a low-resistance metal film selectively deposited on said first conductor member and on said second conductor member.

11. A semiconductor device comprising:
a first conductor member formed on a part of a semiconductor substrate and having a contact formation region, said first conductor member having a linear configuration composed of a plurality of linear portions and at least one bent portion connecting said linear portions in a plane parallel with a surface of said semiconductor substrate;
an insulating film covering said first conductor member except for said contact formation region and said bent portion;
a low-resistance layer formed in contact with a surface of said contact formation region of said first conductor member and with a surface of said bent portion of said first conductor member; and
a contact formed on said low-resistance layer, which is formed on said contact formation region.

12. A semiconductor device according to claim 11, wherein the linear portions of said first conductor member are parallel with each other and said first conductor member has a meander configuration.

13. A semiconductor device according to claim 12, further comprising:
a second conductor member formed to extend over all the linear portions of said first conductor member; and
another low-resistance layer formed in contact with a surface of said second conductor member and composed of the same material as the low-resistance layer on said first conductor member,
said semiconductor device being capable of selecting at least one of an inductor, a resistor, and a capacitor and allowing the selected one to function by using said first and second conductor members and said insulating film.

14. A semiconductor device according to claim 13, wherein said second conductor member has a contact region extending outwardly of the outermost ones of the linear portions of said first conductor member, said semiconductor device further comprising:
a plurality of interconnect layers formed above said first and second conductor members with an interlayer insulating film interposed therebetween;
a first connecting member for connecting said individual interconnect layers to the contact formation region of said first conductor member; and
a second connecting member for connecting said individual interconnect layers to a plurality of portions of the contact formation region of said second conductor member, wherein
a signal delay circuit is formed between said first and second connecting members.

15. A semiconductor device according to claim 11, wherein said first conductor member is configured as a polygonal helix extending outwardly from a center end thereof and terminating at an outer end thereof and
said plurality of linear portions of said first conductor member correspond to individual sides of said polygonal helix and said bent portion of said first conductor member corresponds to a vertex of said polygonal helix.

16. A semiconductor device according to claim 15, further comprising:
a second conductor member composed of a conductor material and formed into distinct segments each extending over the linear portions parallel with each other and located on the same side relative to the center end of said first conductor member configured as the polygonal helix; and
another low-resistance layer formed in contact with a surface of said second conductor member and composed of the same material as the low-resistance layer on said first conductor member,
said semiconductor device being capable of selecting at least one of an inductor, a resistor, and a capacitor and allowing the selected one to function by using said first and second conductor members and said insulating film.

17. A semiconductor device according to claim 16, wherein
the segments of said second conductor member have respective contact regions extending outwardly of the outermost ones of the linear portions of said first conductor member, said semiconductor device further comprising:
a plurality of interconnect layers formed above said first and second conductor members with an interlayer insulating film interposed therebetween;
a first connecting member for connecting said individual interconnect layers to the contact formation region of said first conductor member; and
a second connecting member for connecting said individual interconnect layers to a plurality of portions of the contact formation region of said second conductor member, wherein
a signal delay circuit is formed between said first and second connecting members.

18. A semiconductor device according to claim 11, further comprising
a dummy conductor member arranged in parallel with the outermost ones of the linear portions of said first conductor member on said semiconductor substrate and having a contact formation region.

19. A semiconductor device according to claim 18, wherein said dummy member has a potential fixed to a specified value via said contact formation region.

20. A semiconductor device according to claim 11, wherein said insulating film covers most of said bent portion.

* * * * *